United States Patent [19]

Kobayashi

[11] 3,889,254

[45] June 10, 1975

[54] MEASURING APPARATUS

[75] Inventor: Goro Kobayashi, Oisomachi, Japan

[73] Assignees: Oki Electric Industry Co., Ltd.; Japan Society for the Promotion of Machine Industry, both of Minato-ku, Tokyo, Japan

[22] Filed: July 20, 1973

[21] Appl. No.: 381,236

[30] Foreign Application Priority Data

July 24, 1972 Japan ............ 47-73456
Dec. 28, 1972 Japan ............ 47-130209

[52] U.S. Cl. ............ 340/347 NT; 235/150.51; 340/347 AD

[51] Int. Cl. ............ H03k 13/02

[58] Field of Search ......... 340/347 NT; 235/150.51, 235/150.52, 150.53

[56] References Cited

UNITED STATES PATENTS

| | | | |
|---|---|---|---|
| 3,368,149 | 2/1968 | Wasserman | 340/347 NT |
| 3,582,947 | 6/1971 | Harrison | 340/347 NT |
| 3,631,467 | 12/1971 | Vojvodich et al. | 340/347 NT |
| 3,733,600 | 5/1973 | Hellwarth et al. | 340/347 NT |
| 3,737,892 | 6/1973 | Dorey | 340/347 NT |

*Primary Examiner*—Eugene G. Botz
*Assistant Examiner*—Jerry Smith
*Attorney, Agent, or Firm*—Charles E. Pfund, Esq.

[57] ABSTRACT

In a measuring apparatus in which a digital output is provided by an analogue-digital converter, there are provided a fixed impedance and a variable impedance whose impedance is varied in accordance with a measured quantity which are connected in series across a source of voltage. The terminal voltage across the fixed impedance is applied to the analogue-digital converter to act as the internal reference voltage thereof and the sum of the terminal voltages across the fixed and variable impedances is applied to the analogue-digital converter to act as an input thereto.

7 Claims, 9 Drawing Figures

MEASURING APPARATUS

BACKGROUND OF THE INVENTION

This invention relates to measuring apparatus utilizing a sensor whose impedance varies according to a measured quantity.

A bridge circuit has been used exclusively to produce an electric output from such a sensor. Since a bridge circuit measures the measured quantity by zero method it is necessary to use a meter or a galvanometer of high sensitivities and such method has been an effective method from an early stage where an efficient amplifier was not yet available. Accordingly, bridge circuits are used extensively in the art of measurement. Bridge circuits are utilized in automatic measuring apparatus according to two schemes as follows. According to one scheme, a servo mechanism is used in such a manner as to always balance the bridge circuit so as to derive out the balanced condition as an output. According to the other scheme, the bridge circuit is caused to balance against a reference value of the measured quantity so as to provide an output whenever the measured quantity is different from the reference value. However, the former is defective in that its construction is complicated because it is necessary to use a servo mechanism and the latter is defective in that its output characteristic is not linear. Further, since the output of the latter scheme is a function of the voltage impressed upon the sensor, it is necessary to maintain this voltage at a constant value.

In the art of measurement it is often necessary to collect and process a plurality measured quantities.

FIG. 4 of the accompanying drawing shows a basic construction of a prior art measuring apparatus for sequentially collecting and processing a plurality of measured quantities, in which samples of measured quantities produced by a plurality of measuring devices $T_1$ through $T_n$ are sequentially taken out through a multiplexer 31 and are then stored in a sample holder 32. Then, the samples are passed through an analogue-digital converter 33 and the outputs thereof are processed by a processing device 34 for recording, display or computation.

There are many types of such measuring devices $T_1$ through $T_n$ utilized in this arrangement. Although some types of the measuring devices create electromotive forces in response to the measured quantities, most of the measuring devices utilize a source of voltage. Accordingly, the output voltage of the measuring device varies depending upon the source voltage so that it is necessary to maintain the source voltage at a constant value. Most of the meters which compare the measured quantities with a reference value produce outputs proportional to the differences between the measured quantities and the reference value. In this type it is also necessary to maintain the reference value at a constant value. The measuring apparatus of the type shown in FIG. 4 has been constructed without considering these problems so that the defect of any measuring device degrades the accuracy of the entire measuring apparatus.

SUMMARY OF THE INVENTION

Accordingly, it is an object of this invention to provide a novel measuring apparatus utilizing an analogue-digital converter for producing a digital output in which it is not necessary to use a source of constant voltage for energizing the measuring device.

Another object of this invention is to provide a novel measuring apparatus capable of sequentially collecting and processing the outputs of a plurality of measuring devices without using any source of constant voltage.

According to one aspect of this invention there is provided a measuring apparatus in which a digital output is provided by using an analogue-digital converter, characterized in that said measuring apparatus comprises a source of voltage, a fixed impedance, a variable impedance which varies its impedance in accordance with a measured quantity, the fixed and variable impedances being connected in series across said source, an analogue-digital converter, means to apply the terminal voltage across the fixed resistor to the analogue-digital converter to act as the internal reference voltage of the analogue-digital converter, and means to apply the sum of the terminal voltages across the fixed and variable impedances to the analogue-digital converter to act as an input thereto.

According to another aspect of this invention, there is provided a measuring apparatus wherein the measured quantities measured by a plurality of measuring devices are converted into digital quantities by means of a plurality of analogue-digital converters, characterized in that the measuring apparatus is provided with means to apply the source voltage for the measuring devices to the analoguedigital converters to act as the reference voltage thereof and means for selectively connecting the outputs of the analogue-digital converters to a common counter.

DETAILED DESCRIPTION OF THE PREFERRED EMBODIMENTS

Figure 1:
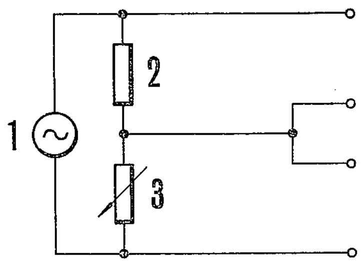
FIG. 1 shows a diagram for explaining the principle of the invention.

Referring now to FIG. 1 which is useful to explain the principle of this invention, a source 1 of voltage $E_0$ is connected across serially connected fixed impedance 2 having an impedance $Z_1$ and a variable impedance 3 having an impedance $Z_2$ which is varied in accordance with the measured quantity. When the terminal voltage of the fixed impedance 2 is denoted by $E_1$ and that the variable impedance 3 by $E_2$, and the current flowing through these impedances by I, following equations hold:

$$I = \frac{E_0}{Z_1 + Z_2} \qquad 1$$

$$E_1 = IZ_1 = \frac{E_0 Z_1}{Z_1 + Z_2} \qquad 2$$

$$E_2 = IZ_2 = \frac{E_0 Z_2}{Z_1 + Z_2} = \qquad 3$$

Put $e = \frac{E_1 - E_2}{E_1}$, then $$e = \frac{E_1 - E_2}{E_1} = 1 - \frac{E_2}{E_1} = 1 - \frac{Z_2}{Z_1} \qquad 4$$

Let us consider a case in which the relationship between the measured quantity $\theta$ and impedance $Z_2$ is expressed by an equation $Z_2 = Z_0(1 + \alpha\theta)$, where $\alpha$ represents a coefficient specific to a sensor. In the case of a resistance thermometer, $\theta$ represents the measured temperature and $\alpha$ the temperature coefficient of resistance.

It $Z_0$ is selected to be equal to $Z_1$, then equation 4 is rewritten as $$e = 1 - \frac{Z_2}{Z_1} = -\alpha\theta \qquad (5)$$

This equation shows that $e$ is directly proportional to the measured quantity $\theta$, in which $\alpha$ represents a proportionality constant.

Figure 2:
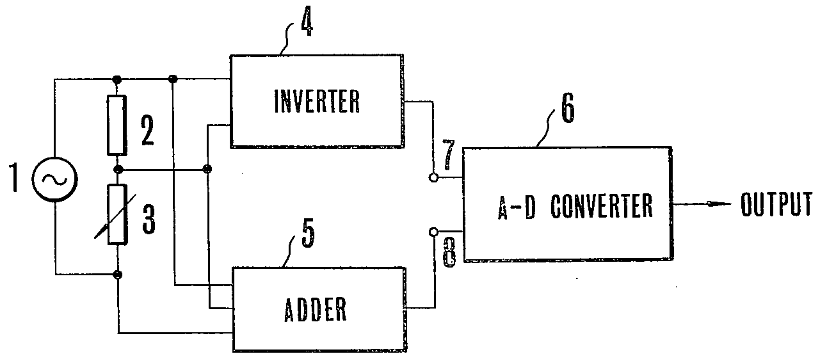
FIG. 2 is a block diagram showing one embodiment of the invention.

FIG. 2 is a diagram showing one embodiment of this invention, in which 4 shows an inverter having an amplification factor or gain of unity, 5 an adder and 6 an analoguedigital converter.

The embodiment shown in FIG. 2 operates as follows: More particularly, the terminal voltage $E_1$ is applied to one input 7 of the analogue-digital converter 6 via inverter 4. Since the polarities of the terminal voltages $E_1$ and $E_2$ across the fixed impedance 2 and the variable impedance 3 are opposite, an output $E_1 - E_2$ is applied to the other input 8 of the analogue-digital converter 6 from adder 5. In other words in the circuit shown in FIG. 2, the terminal voltage across the fixed impedance is used as the internal reference voltage of the analogue-digital converter 6, and the sum of the terminal voltage across the fixed impedance and the terminal voltage across the variable impedance is used as the input to analogue-digital converter.

The conversion operation in the analogue-digital converter 6 will now be described in terms of double integration type.

Figure 3:
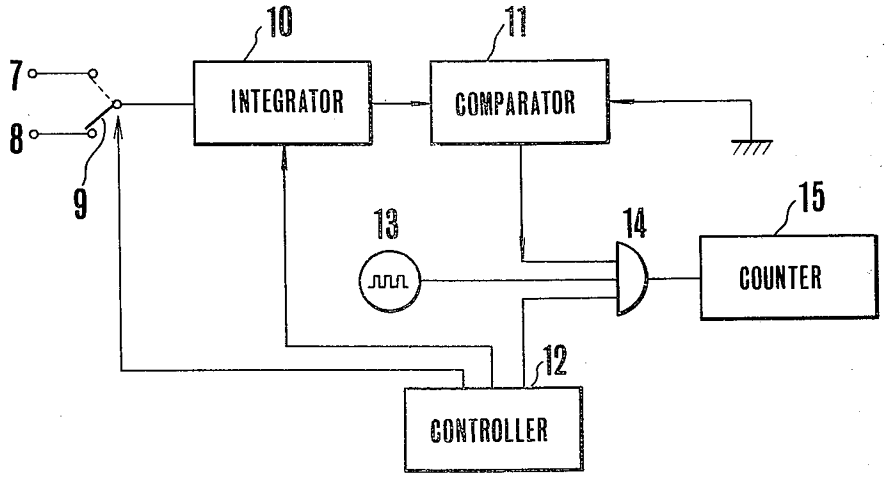
FIG. 3 is a block diagram showing a modified embodiment of this invention utilizing an analogue-digital converter of the double integration type.

FIG. 3 is a block diagram showing an analoguedigital converter of the double integration type, in which 9 shows a transfer switch, 10 an integrator, 11 a comparator, 12 a controller, 13 a pulse oscillator, 14 a gate circuit and 15 a counter.

When the controller 12 operates, an instruction is given to the integrator 10 to cause it to integrate an input voltage $(E_1 - E_2)$ for a definite internal $T_0$, thus $$\int_0^{T_0} [illegible]\, dt \; (E_1 - E_2)\, T_0$$

Then controller 12 gives an instruction to transfer the transfer switch 9 and to enable the gate circuit 14 to apply the pulse from the pulse oscillator 13 to counter 15 whereby the counter begins to count. As above described, since the polarity of the internal reference voltage $E_1$ is opposite to that of the input voltage, when the reference voltage is integrated by the integrator 10, the output of the integrator 10 decreases. The comparator determines a time instant at which the output of the integrator 10 returns to the original value and produces an output at that time, thus enabling the gate circuit 14. Thus $$\int_0^{T_0+T} E_1\, dt = E_1 T$$

$$(E_1 - E_2)\, T_0 = E_1 T$$

$$T = \frac{E_1 - E_2}{E_1}\, T_0 \cdots\cdots\cdots\cdots \quad 6$$

Putting $T_0 = 1/\alpha$, then from equation 5, equation 6 can be rewritten as follows $$T = \frac{E_1 - E_2}{E_2}\, T_0 = eT_0 = -\alpha\theta \cdot \frac{1}{\alpha} = -\theta$$

This means that the counted value T represents the measured quantity $\theta$.

As above described, the invention provides a novel measuring apparatus which is simple in construction because it does not use any servo mechanism, and which has a high working stability because it is not necessary to use an independent source of reference voltage for the analogue-digital converter. Accordingly, it is not necessary to consider the stability of the source when the apparatus is used as a terminal device of a telemeter system, and the output of the analogue-digital converter is a digital value so that it is easy to process it in the subsequent stage.

Figures 4, 5, 6:
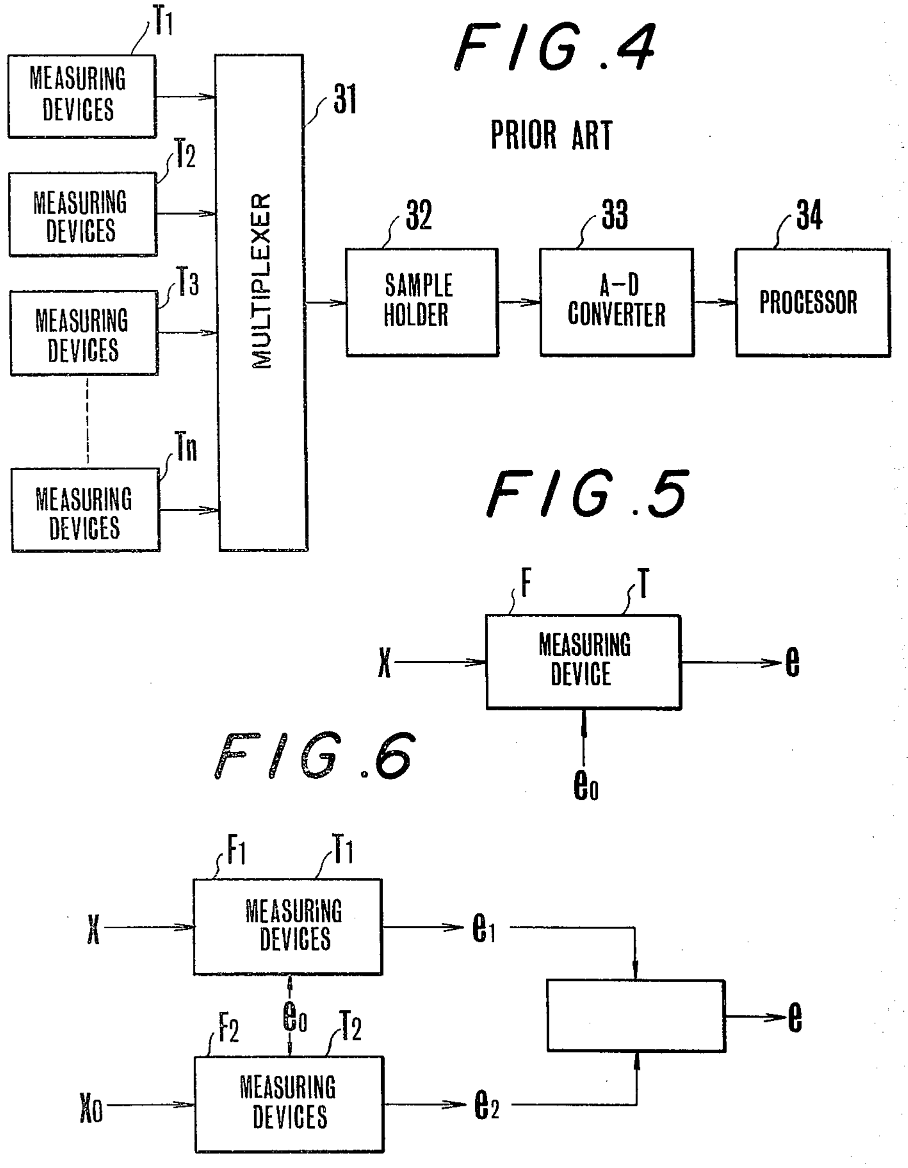
FIG. 4 is a block diagram showing a prior art measuring apparatus for sequentially collecting and processing the outputs of a plurality of measuring devices.
FIGS. 5 and 6 are block diagrams showing a measuring device.

Referring now to FIGS. 5 and 6, the measured quantity is denoted by X, the voltage of a source applied to a measuring device T is denoted by $e_0$, the output voltage of the measuring device is denoted by e and the transfer function is denoted by F. Then the output voltage e can be shown by the following equation $$e = XFe_0 \qquad 1'$$

Thus, the output voltage e is proportional not only to the measured quantity X, but also to the transfer function F and the source voltage $e_0$ so that it can be noted that in order to increase the accuracy of the measurement, it is necessary to stabilize F and $e_0$ at the same accuracy.

FIG. 6 shows a circuit for comparison measurement in which $X_0$ represents a reference value for a measured quantity X, $e_0$ a voltage impressed upon measuring devices $T_1$ and $T_2$, $e_1$ and $e_2$ the output voltages of the measuring devices, $F_1$ and $F_2$ the transfer functions of the measuring devices $T_1$ and $T_2$, respectively. Since, it is usual to adjust to satisfy a condition $F_1 = F_2 = F$, the output $e$ is shown as follows.

$$e_1 = X F_1 e_0\,, \qquad e_2 = X_0 F_2 e_0 \qquad e = (X - X_0)\, F\, e_0$$

In many cases, the output is shown by a positive or negative value with respect to the output $e = 0$ which is the output where $X = X_0$.

In this case too, the output is proportional to F and $e_0$. Accordingly, the ratio $e/e_2$ is expressed by $$\frac{e}{e_2} = \frac{X - X_0}{X_0} \qquad 3'$$

This equation shows that the ratio $e/e_2$ is independent of F and $e_0$.

Here before, such calculation was possible, only by using a division circuit on the output side of the measuring device and by applying the result to a multiplier.

The invention utilizes the division function of an analogue-digital converter to provide a ratio measuring system.

The division function of an analogue-digital converter is as follows.

Figure 7:
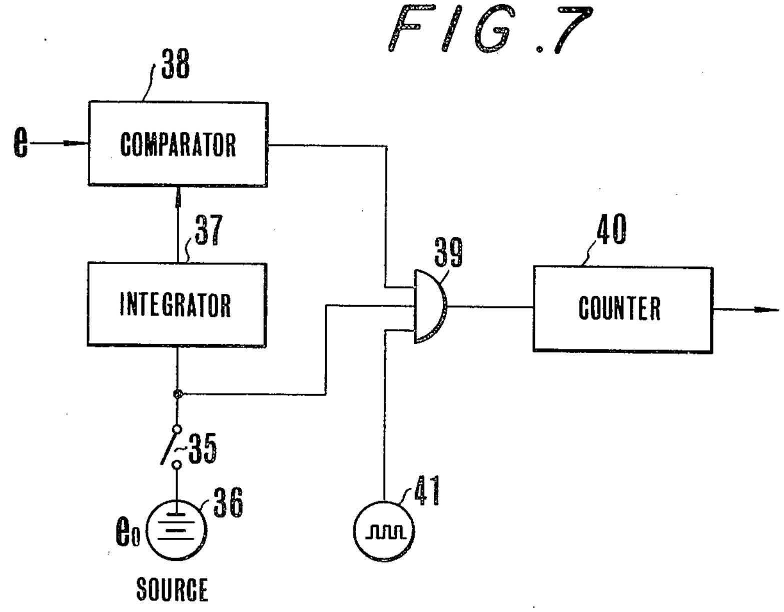
FIG. 7 is a block diagram showing an analoguedigital converter.

FIG. 7 shows an analogue-digital converter in which the output voltage $e_0$ of a source 36 is applied to an integrator 37 by closing a switch 35. Thus, source voltage $e_0$ is integrated by the integrator 37 and the output thereof is compared with a measured value $e$ by a comparator 38. A gate circuit 39 is connected to receive the output of comparator 38, the voltage $e_0$ of the source 36 and the pulse from a pulse oscillator 41. Thus, when switch 35 is closed, a counter 40 starts to count the pulses. When the integrated value of the integrator 37 becomes equal to the measured value $e$, the comparator 38 produces an output thereby closing the gate circuit 39. In other words, the pulse is counted during an interval between the closure of switch 35 and the generation of an output from comparator 38. Denoting this interval by T $$\int_0 e_0 dt = e_0 T = e \qquad 4'$$

$$T = \frac{e}{e_0} \qquad 5'$$

Accordingly, if the counter 40 displays directly the interval T, the reading of counter 40 will represent the ratio $e/e_0$.

Since the analogue-digital converter is set to a condition in which $e_0 = 1$, the reading of T digitally indicates the input voltage $e$.

Although the above description relates to an analogue-digital converter of the most simple type, analogue-digital converters of the sequential comparison type and of the double integration type also have a division function.

Figure 8:
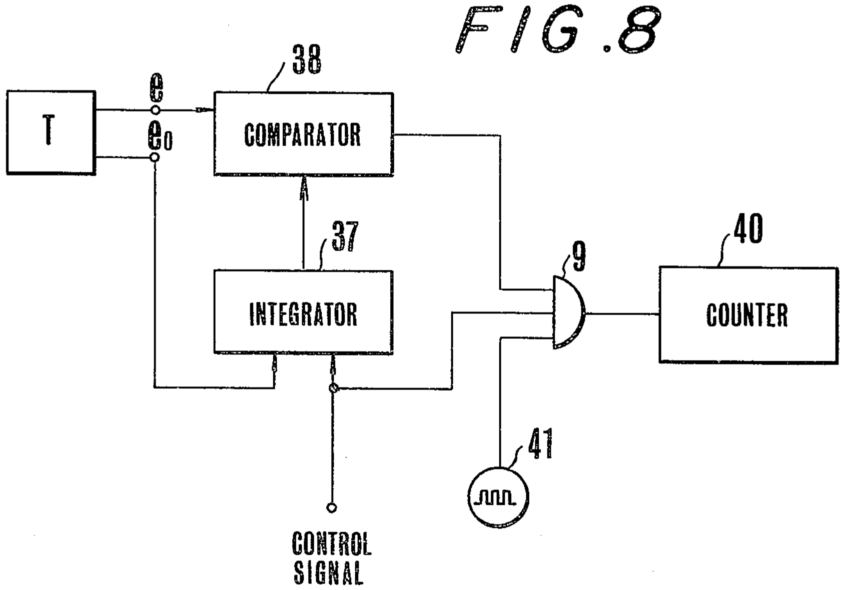
FIG. 8 is a block diagram showing a combination of a measuring device and an analogue-digital converter.

To have better understanding of the invention, the circuit shown in FIG. 8 will first be described. FIG. 8 is a block diagram showing a combination of the analogue-digital converter shown in FIG. 7 and a measuring device. In FIG. 8, the circuit elements identical to those shown in FIG. 7 are designated by the same reference numerals. That is $e$ shows the output of a measuring device T and $e_0$ the source voltage for the measuring device T.

Where the analogue-digital converter is of the sequential comparison type, the digital output shows the ratio of two inputs.

Figure 9:
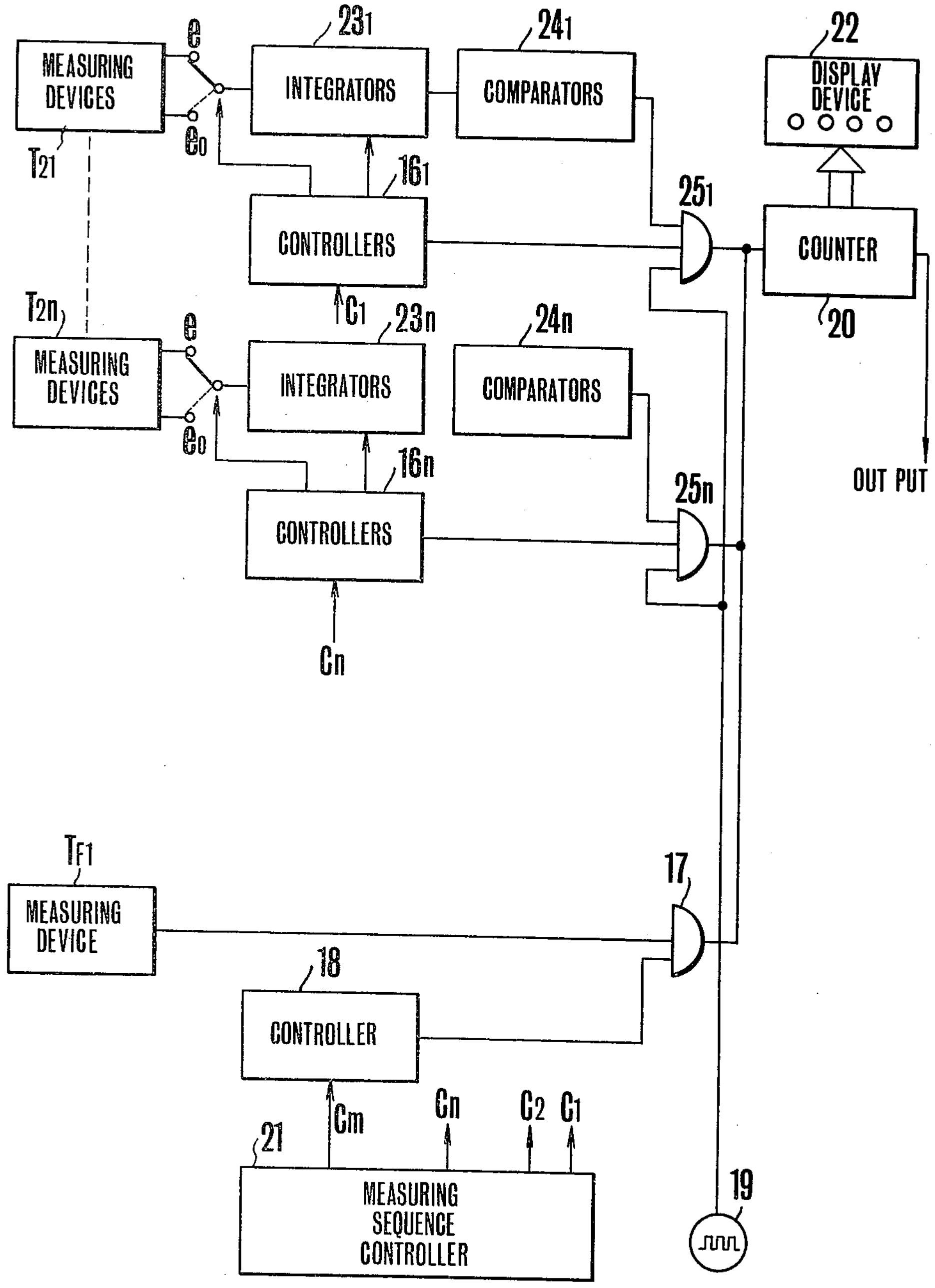
FIG. 9 is a block diagram showing a modified embodiment of this invention.

FIG. 9 shows an embodiment of this invention in which a plurality of measuring devices similar to that shown in FIG. 6 are used. In FIG. 9 $T_{21}$ through $T_{2n}$ represent measuring devices each applied with a source voltage $e_0$ and produces two outputs, and $TF_1$ represents a measuring device constructed to produce a frequency modulated output or a measuring device producing an absolute value of the measured quantity. The measuring device does not require decision operation described above. In the same manner as that described in connection with FIG. 3, integrators $\mathbf{23}_1 \ldots \mathbf{23}_n$, comparators $\mathbf{24}_1 \ldots \mathbf{24}_n$, gate circuits $\mathbf{25}_1 \ldots \mathbf{25}_n$, and controllers $\mathbf{16}_1 \ldots \mathbf{16}_n$ are associated with measuring devices $T_{21} \ldots T_{2n}$. However, only a gate circuit 17 and a controller 18 are associated with the measuring device $TF_1$ which produces frequency modulated outputs. A pulse oscillator 19 and a counter are provided in common for all measuring devices $T_{21} \ldots T_{2n}$. The controllers $\mathbf{16}_1 \ldots \mathbf{16}_n$ and 18 are controlled sequentially by a measuring sequence controller 21 so as to sequentially integrate the quantities measured by measuring devices $T_{21} \ldots T_{2n}$ and $TF_1$. The pulse of the pulse oscillator 19 are applied to respective gate circuits $\mathbf{25}_1 \ldots \mathbf{25}_n$ so that the outputs from gate circuits $\mathbf{25}_1 \ldots \mathbf{25}_n$ and 17 are sequentially counted by a counter 20 and the counts of the counter 20 are displayed by a display device 22 or processed by a computor, not shown.

Although in the prior art measuring apparatus shown in FIG. 4 the switching of the measuring devices is made by a multiplexer 31, or an analogue switch, according to this invention shown in FIG. 9, the switching is made by gate circuits for the digital quantities so that the switching can be made more readily. Moreover, as the terminal voltage of the fixed impedance is utilized as the internal reference voltage of the analogue-digital converter, it is not necessary to use a DC source of a constant voltage.

By properly determining the integration times of the analogue-digital converter for respective measuring devices, the digital values after analogue-digital conversion can be read directly, thereby simplifying the scaling of display devices.

In addition, it is possible to combine a measuring device having a frequency output with the measuring apparatus.

What is claimed is:

1. In a measuring system in which a digital output representative of a measured analogue quantity is provided by using an analogue voltage responsive circuit and an analogue-digital converter, the improvement wherein said responsive circuit comprises a source of voltage, a fixed impedance, a variable impedance which varies its impedance in accordance with a measured quantity, said fixed and variable impedances being connected in series across said source; means to apply the terminal voltage across said fixed impedance to said analogue-digital converter to act as the internal reference voltage of said analogue-digital converter; and means to apply the sum of the terminal voltages across said fixed and variable impedances to said analogue-digital converter to act an an input thereto.

2. The measuring apparatus according to claim 1 wherein said first mentioned means comprises an inverter connected across said fixed impedance.

3. The measuring apparatus according to claim 2 wherein said second mentioned means comprises an adder connected to receive the terminal voltages across said fixed and variable impedances thereby producing the sum of said terminal voltages.

4. The measuring apparatus according to claim 1 wherein said analogue-digital converter is of the double integration type and comprises an integrator, a transfer switch connected between the outputs of said first and second means and the input of said integrator, a comparator connected to the output of said integrator, a source of pulse, a counter connected to said source of pulse and the output of said comparator through a gate circuit and a controller for controlling the operations of said transfer switch, said integrator and said gate circuit.

5. In a measuring apparatus wherein the measured quantities measured by a plurality of measuring devices are converted into digital quantities by means of a plurality of analoguedigital converters, the improvement which comprises means according to claim 1 to apply the source voltage for said measuring devices to said analogue-digital converters to act as the reference voltage thereof, and means for selectively connecting the outputs of said analogue-digital converters to a common counter.

6. The measuring apparatus according to claim 5 wherein each of said analogue-digital converters associated with each of said measuring devices comprises an integrator, a transfer switch for transfer connecting the input of said integrator between the source voltage of said measuring device and the output thereof, a comparator responsive to the output of said integrator, and a controller for controlling the operation of said transfer switch and said integrator.

7. A measuring system according to claim 1 which comprises a plurality of measuring devices each including a sensor divided into a first portion and a second portion energized by a common source, and an analogue-digital converter connected operatively to said measuring devices respectively for receiving said voltage from said first portion at its input terminal and said reference voltage from said second portion at its reference input terminal to produce a digital ratio of said voltage and said reference voltage, said ratio being devoid of common source fluctuations in said voltage and said reference voltage.

* * * * *

UNITED STATES PATENT AND TRADEMARK OFFICE
CERTIFICATE OF CORRECTION

PATENT NO. : 3,889,254
DATED : June 10, 1975
INVENTOR(S) : Goro Kobayashi

It is certified that error appears in the above-identified patent and that said Letters Patent are hereby corrected as shown below:

Column 3, line 63, after "thus" correct the illegibility of the equation to read:

$$-- \int_0^{T_0} (E_1 - E_2)dt = (E_1 - E_2)\, T_0 \quad --$$

Column 4, line 12, after "Thus" correct the illegibility of the equation to read:

$$-- \int_0^{T_0 + T} E_1 dt = E_1 T$$

$$(E_1 - E_2)\, T_0 = E_1 T$$

$$T = \frac{E_1 - E_2}{E_1} T_0 \quad \ldots\ldots\ldots\ldots 6 \quad --$$

Column 5, line 35, after "T" correct the illegibility of the equation to read:

$$-- \int_0^{T} e_0 dt = e_0 T = e \quad \ldots\ldots\ldots\ldots 4' \quad --$$

Signed and Sealed this

*twenty-seventh* Day of *April 1976*

[SEAL]

*Attest:*

RUTH C. MASON
*Attesting Officer*

C. MARSHALL DANN
*Commissioner of Patents and Trademarks*